United States Patent
Prokopp et al.

[19]

[11] Patent Number: 6,086,322
[45] Date of Patent: Jul. 11, 2000

[54] AUTOMATED CIRCUIT BOARD TESTER

[75] Inventors: Manfred Prokopp, Wertheim-Reicholzheim; Rudi Geier, Kulsheim-Hundheim; Josef Mozzi, Gaildorf, all of Germany

[73] Assignee: ATG Test Systems GmbH, Wertheim, Germany

[21] Appl. No.: 08/902,549

[22] Filed: Jul. 29, 1997

[30] Foreign Application Priority Data

Aug. 2, 1996 [DE] Germany .......................... 196 31 368

[51] Int. Cl.[7] .................................................. B65G 59/04
[52] U.S. Cl. .................. 414/797; 414/795.8; 414/796.7; 414/900
[58] Field of Search .............................. 414/795.8, 796.7, 414/796.8, 796.9, 797, 900

[56] References Cited

U.S. PATENT DOCUMENTS

| | | | |
|---|---|---|---|
| 3,046,848 | 7/1962 | Twitchell et al. | 414/796.7 X |
| 3,991,888 | 11/1976 | Beckius et al. | 414/795.8 |
| 4,047,622 | 9/1977 | Blessing | 414/796.7 X |
| 4,854,815 | 8/1989 | Augst | 414/795.8 X |
| 5,298,008 | 3/1994 | Decker et al. | 414/797 X |

FOREIGN PATENT DOCUMENTS

| | | | |
|---|---|---|---|
| 489 820 | 1/1930 | Germany . | |
| 871 158 | 3/1953 | Germany . | |
| 1 068 729 | 11/1959 | Germany . | |
| 1 206 923 | 12/1965 | Germany . | |
| 70 38 781 | 10/1970 | Germany . | |
| 1 611 389 | 12/1970 | Germany . | |
| 34 42 123 A1 | 5/1986 | Germany | B65H 3/24 |
| 07058494 | 3/1995 | Japan . | |

OTHER PUBLICATIONS

Aycock, T.L. and Hetherington, J.C., "Feed Mechanism For Printed Circuit Boards," (Techanical Digest No. 26). North Carolina: Western Electric (Apr. 1972).

*Primary Examiner*—Janice L. Krizek
*Attorney, Agent, or Firm*—Hamilton, Brook, Smith & Reynolds, P.C.

[57] ABSTRACT

An automated circuit board tester comprises an unstacker (1) arranged upstream of a testing device and which by means of a circuit board picker (40) arranged above a chute (30) picks a top-most circuit board from a stack of circuit boards (55) located in the chute (30). The chute (30) comprises a lifting device including at least two sets of vertically travelling supporting elements (38, 101), each of which is able to carry a stack of circuit boards (55). The chute (30) is open at least on one side so that a set of supporting elements (38, 101) can be loaded while a stack of circuit boards (55) located on the other set of supporting elements (38, 101) is unstacked by the circuit board picker (40).

9 Claims, 8 Drawing Sheets

AUTOMATED CIRCUIT BOARD TESTER

BACKGROUND OF THE INVENTION

Automated circuit board testers are testers linked to a transport system that picks circuit boards from a stack, supplies them to a testing device, and from there to a restacker for restacking the circuit boards into one or more stacks. Accordingly, such automated circuit board testers comprise an unstacker, a testing device, and a restacker.

In the unstacker, the circuit boards, supplied in a stack, are picked one after the other and transported to the testing device. In the testing device the circuit boards are tested by device of contact and short-circuit tests known as such. From the testing device, the tested circuit boards are moved on to the restacker where they are preferably deposited in two separate chutes distinguishing faulty circuit boards from faultless circuit boards.

From German Patent Document DE 34 42 123 A1 an unstacker for picking circuit boards one after the other from a stack is known. This unstacker features a chute in an inclined arrangement open at the top, in which a stack of circuit boards to be unstacked is located. At the bottom end of the chute, a roller is provided parallel to a side edge of the lowermost board. This roller has a step running parallel to the side edge of the lowermost board to grip the side edge and extract the lowermost board from the stack of boards and to place it by means of an ejector lever onto a board placement table.

In the case of this unstacker, the chute can be continually replenished without having to interrupt continual operation. The drawback in this arrangement is, however, that the complete weight or load of the stack is borne by the lowermost board, as a result of which stacking height is restricted since the lowermost board must not be exposed to excessive loading. The circuit boards need to have a thickness permitting clamping of the circuit boards not to be picked. The outer contour of the circuit boards must comprise at least two straight parallel edges to be precisely gripped by the roller. In addition to this, and especially in the case of electric circuit boards, there is a risk of the circuit boards being damaged during picking, due to the lowermost board being shifted out from under the stack of circuit boards arranged above.

To obviate these drawbacks unstackers exist which remove in each case the topmost circuit board from a stack of circuit boards by a suction device and place it on a transport belt. This kind of unstacking is termed "pick and place".

In this arrangement the topmost circuit board is totally free of load and picking is done practically independently of the outer contour. The stack of circuit boards is located in a vertical chute in which the stack is shifted upwards by means of a pusher or the like. The drawback in this unstacker device, however, is that to replenish the chute all operations need to be halted to introduce a new stack into the chute, and the pusher has to be retracted to its starting position.

SUMMARY OF THE INVENTION

The invention concerns a simple and cheap automated circuit board tester, which can be operated continuously. The automated circuit board tester comprises an unstacker arranged upstream of a testing device and which by means of a circuit board picker, arranged above a chute, picks a topmost circuit board from a stack of circuit boards located in the chute. The chute comprises a lifting device including at least two sets of vertically traveling supporting elements, each of which is able to carry a stack of circuit boards. The chute is open at least on one side so that a set of supporting elements can be loaded while a stack of circuit boards located on the other set of supporting elements is unstacked by the circuit board picker In this aspect of the invention, an unstacker and a chute configured like a paternoster are provided. This chute comprises at least two sets of vertically traveling supporting elements each receiving a stack of circuit boards and is open at least on one side so that the chute or supporting elements can be side loaded with a stack of circuit boards. For picking off the topmost circuit board in each case of the topmost stack of circuit boards, a circuit board picker, e.g. like that of the known pick-and place device, is provided.

In operation the supporting elements carrying the topmost stack are raised to maintain the upper edge of the stack at a constant level and to compensate for pick-off by the picker. Once the topmost stack has been completely unstacked by the circuit board picker, a stack of circuit boards located underneath on a further set of supporting elements is conveyed upwards in a fast upwards movement into the picking position so that the circuit board picker is able to continuously pick circuit boards from the chute. A further stack of circuit boards can be introduced into the chute at any time without having to halt the feed of the topmost stack of circuit boards to the circuit board picker and placed on a set of supporting elements arranged underneath.

Accordingly, the unstacker in accordance with the invention is thus able to be operated continually, picking being done without any damage and irrespective of the boards' contour.

In another aspect, an automated circuit board tester is provided as set forth above, including a restacker arranged downstream of the testing device, the restacker comprising at least one restacker chute into which by means of a lifting device the tested circuit boards can be introduced from underneath. The restacker chute comprises several pawls behind which the lifted circuit boards latch into place. The lifting device is configured so that it supports the circuit boards at points distributed about the circuit boards on being lifted.

In this aspect of the invention, a restacker is provided. It comprises a chute disposed above a conveyor. This chute is open at the bottom. At the bottom end of the chute, elastically pliant pawl elements are provided on which a stack of circuit boards rests. Arranged below the conveyor, in the region beneath the chute, is a vertically traveling ram and several pushers. This ram and these pushers can be lifted up through the conveyor to take a circuit board located above them and to transport it into the chute. The elastic pawl elements comply to the downwards movement and briefly deviate the circuit board so that on lowering of the pusher, the circuit board is held by the returning pawl elements. Since several pushers are provided, the circuit boards are supported at several points thus preventing the circuit boards from sagging during lifting.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

The invention will now be described in more detail with reference to the drawing in which.

DESCRIPTION OF THE PREFERRED EMBODIMENTS

Figure 1:
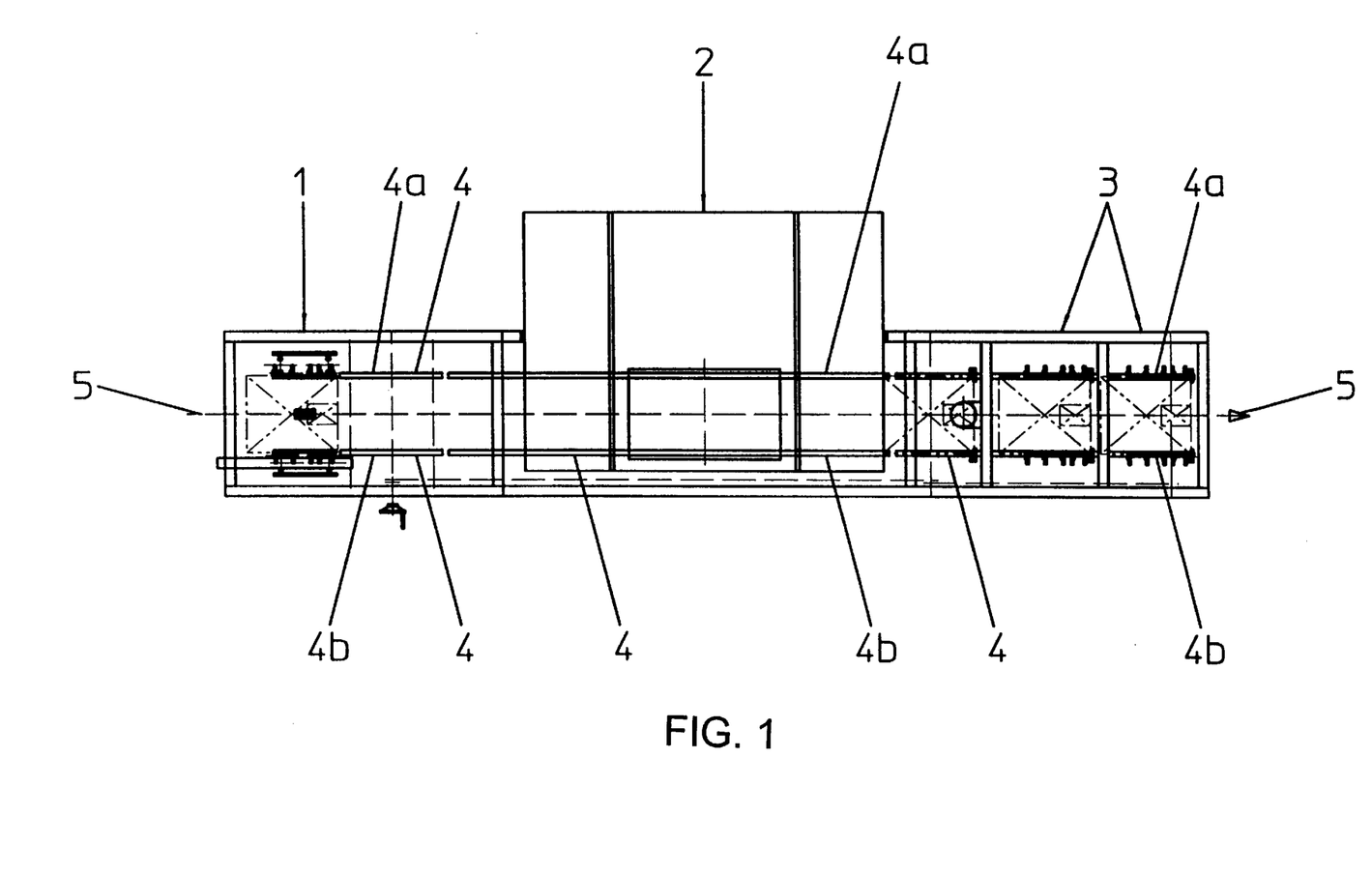
FIG. 1 is a simplified schematic plan view of an automated circuit board tester in accordance with the invention.

FIG. 1 shows an automated circuit board tester in accordance with the invention that comprises an unstacker 1, a testing device 2, and a restacker 3. Provided as the conveyor is a two-part transport belt 4 comprising two individual narrow transport belts 4a, 4b arranged in parallel to each other. The transport belt 4 extends from the unstacker 1 via the testing device 2 to the restacker 3. It may, however, possibly be divided into several longitudinal sections. The transport belt 4 or its sections are moved by a drive device (not shown) in the transport direction 5, a separate drive device being preferably provided for the unstacker 1, the testing device 2, and the restacker 3 so that the circuit boards can be moved and positioned independently of each other.

Figure 2:
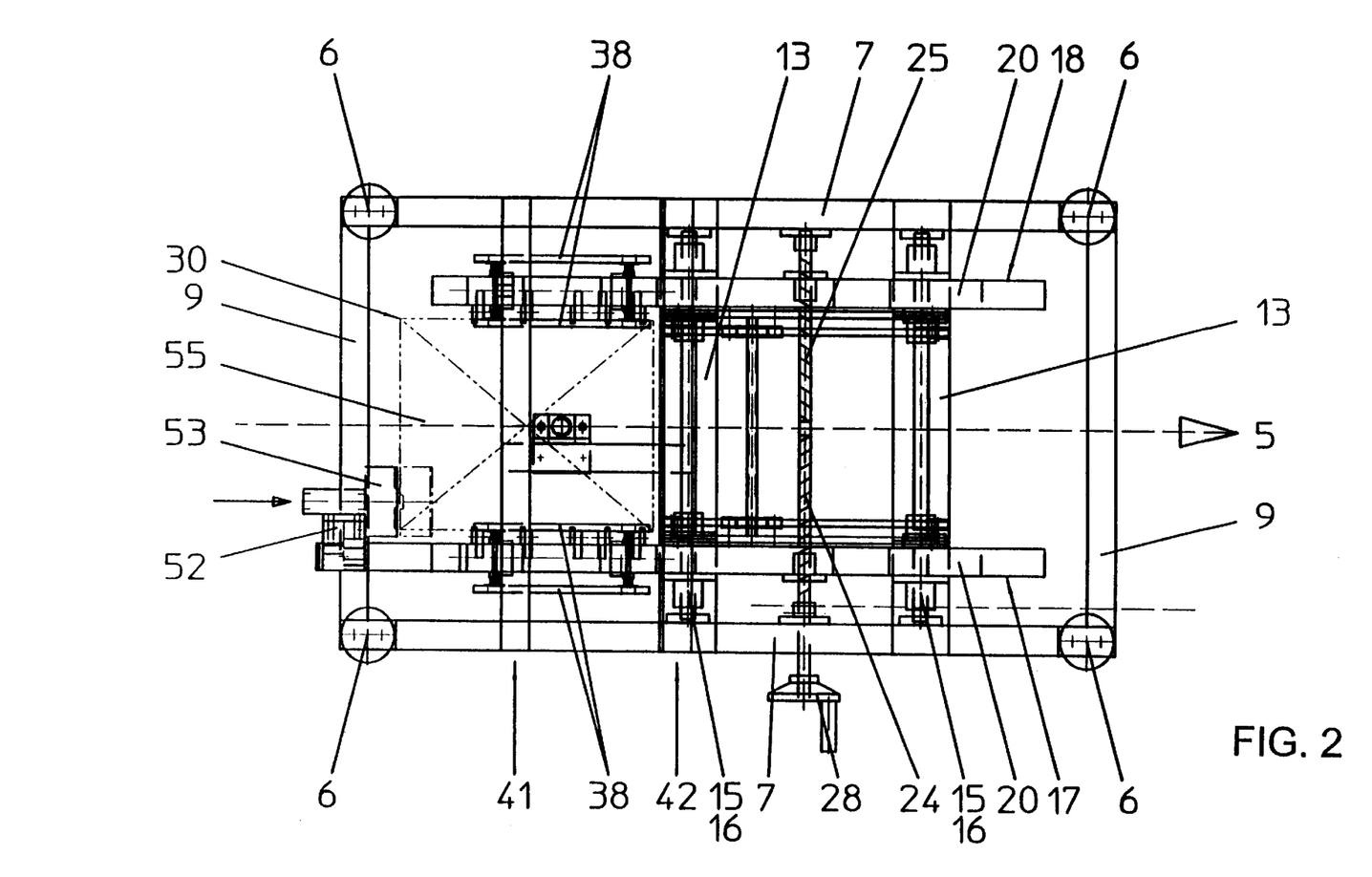
FIG. 2 is a plan view of an unstacker of the automated tester in accordance with the invention.
Figure 3:
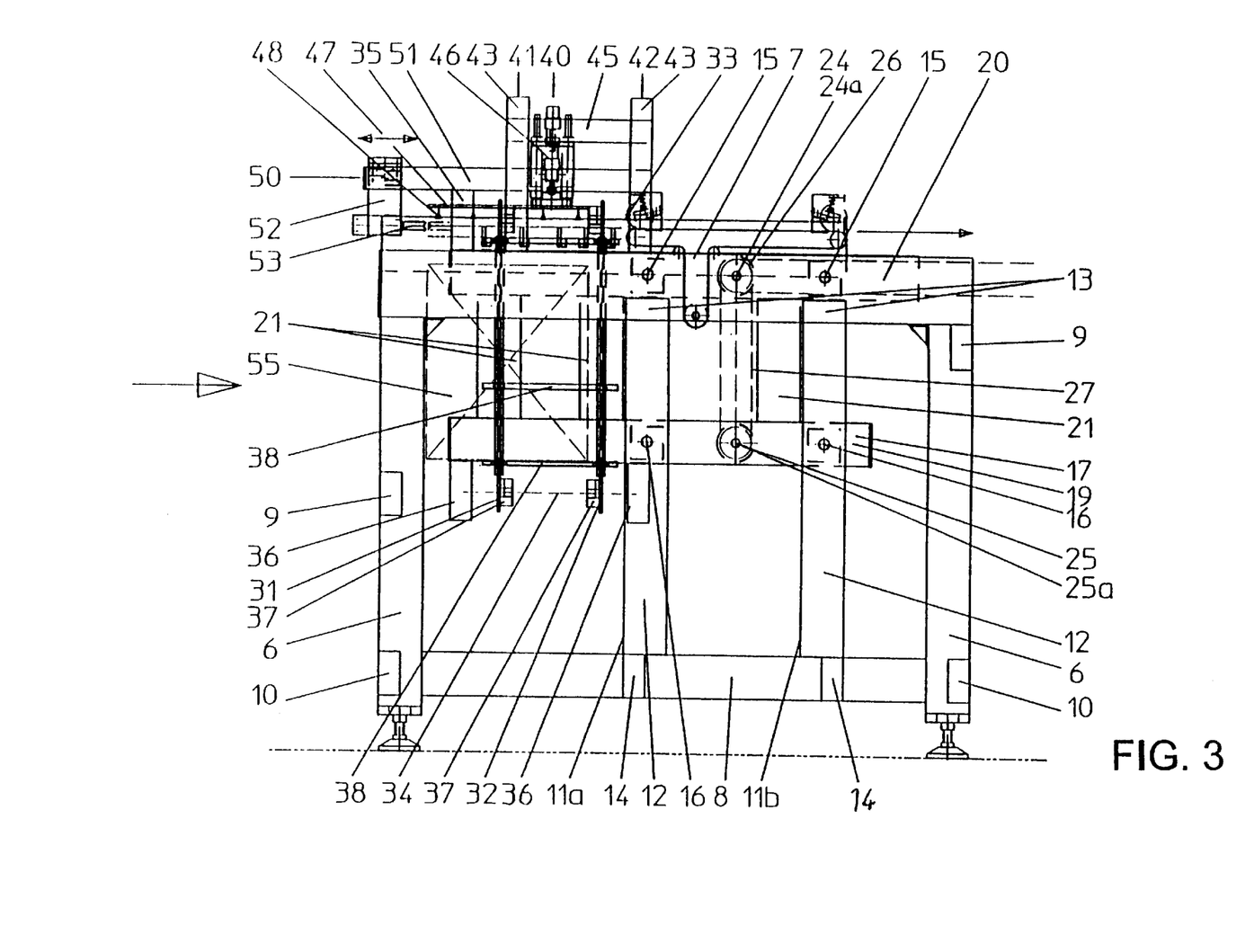
FIG. 3 is a side view of the unstacker shown in FIG. 2.
Figure 4:
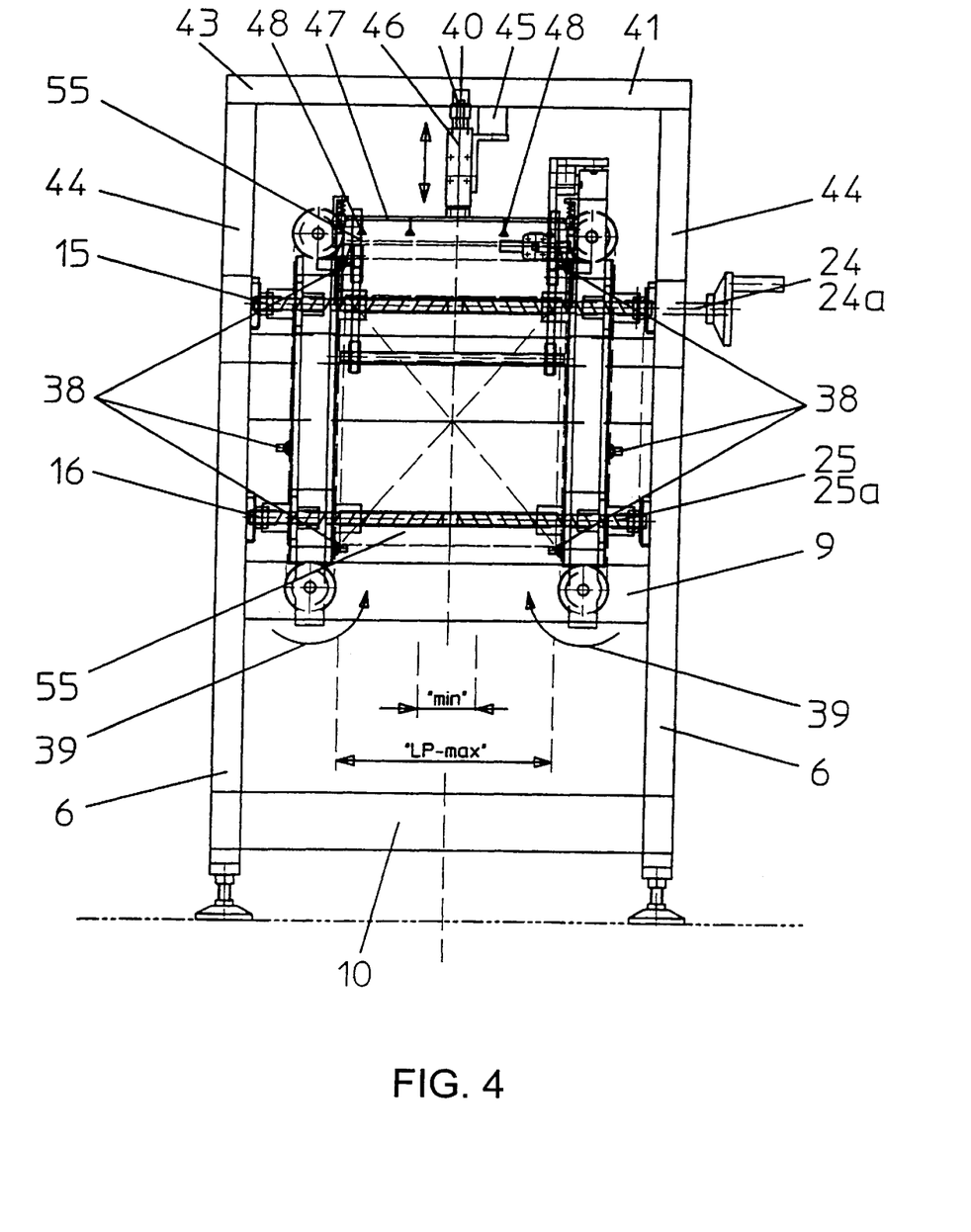
FIG. 4 is front end view of the unstacker shown in FIG. 2.

As shown in FIGS. 2, 3, and 4, the unstacker 1 comprises a cube-shaped frame of four vertical corner beams 6, two upper longitudinal beams 7, two lower longitudinal beams 8, two upper crossbeams 9, and two lower crossbeams 10 (FIGS. 2 to 4). Secured to the cube-shaped frame are two rectangular supporting frames 11a, 11b, each supporting frame comprising an upper and lower horizontal beam 13, 14. Each of the vertical beams 12 extends between an upper and lower longitudinal beam 7, 8 and the horizontal beams 13, 14 between the two upper longitudinal beams 7 and between the two lower longitudinal beams 8, respectively. The upper horizontal beams 13 have flat profiles rectangular in cross-section secured in the region of the lower edge of the upper longitudinal beam 7. Above and parallel to the horizontal beams 13, upper guide rods 15 are secured between the upper longitudinal beams 7. Beneath and parallel to the upper guide rods 15, lower guide rods 16 are arranged, each of which is secured between two vertical beams 12.

Shiftingly disposed on the guide rods 15, 16 are two slides 17, 18, each of which comprises a lower and upper horizontal main beam 19, 20 connected by means of three vertical connecting beams 21 in each case to the slides 17, 18 fixed in a single plane, vertically oriented.

The length of the slides 17, 18 is somewhat shorter than the longitudinal extent of the frame, but roughly twice as long as the spacing between the two supporting frames 11a, 11b. The two supporting frames 11a, 11b are arranged in the transport direction of the circuit boards to be conveyed in the front sector of the frame. The slides 17, 18 extend by their portion disposed downstream in the transport direction 5 by not quite half of their length beyond the supporting frame 11a arranged to the rear.

The upper and lower main beams 19, 20 of the slides 17, 18 are passed through in the region between the frames 11a, 11b by an upper and lower threaded rod 24, 25 each, oriented transversely to the transport direction. In the middle of the threaded rods 24, 25 lengthwise the thread changes from a right-hand thread to a left-hand thread, and the threaded rods engage corresponding tappings 24a, 25a in the main beams 19, 20. Disposed in each lateral portion of the threaded rods 24, 25 is a sprocket 26 about which a chain 27 is guided so that rotation of the two threaded rods 24, 25 is synchronized. The upper threaded rod 24 is extended beyond one of the longitudinal beams 7 and provided outside of the frame with a handwheel 28.

Turning the handwheel 28 rotates the two threaded rods 24, 25 so that the two slides 17, 18' slidingly guided by the guide rods 15, 16' are moved toward or away from each other.

Configured in the rear region of the two slides 17, 18 is a chute 30 in accordance with the invention for the circuit boards to be tested.

This chute 30 is defined laterally by two chains 31, 32, each running about the rear ends of the main beams 19, 20. For guiding the two chains 31, 32, a shaft 33, 34 is mounted at the upper main beam 20 and below the lower main beam 19 respectively and parallel to the main beam 19, 20 in each case on upper and lower bearing blocks 35, 36. Disposed on the shafts are sprockets 37 around which the chains 31, 32 are run. Each of the chains 31, 32 of a slide 17, 18 is connected to a supporting slat 38 serving as a supporting element. The supporting slats 38 are arranged horizontally, the supporting slats 38 of the two slides 17, 18 being disposed in pairs in the chute 30 level and opposite each other. The chains 31, 32 are driven by a drive device (not shown) so that their internal runs move upwards (arrow 39 in FIG. 4).

In the region above the chute 30, a pick-and place device, known as such, serves as the circuit board picker 40.

The circuit board picker comprises two U-shaped retaining bridges 41, 42 arranged in sequence in the transport direction 5 and open at the bottom, each comprising a crossbeam 43, and two slides 44 secured to the longitudinal beams 7 of the frame. Between the two crossbeams 43 a longitudinal rail 45 is secured in the middle, to which a lifting device 46, known as such, is secured. This lifting device 46 is typically a pneumatic piston/cylinder element extending from the longitudinal rail downwards to just above the chute 30. At the lower end of the lifting device 46, a horizontally disposed suction plate 47 incorporating several suction elements 48 is secured. This suction plate 47 can be moved up and down by means of the lifting device vertically between a lower and upper position. The suction elements 48 are pneumatically actuated vacuum sensors known as such.

In addition the circuit board picker 40 features a shifting device 50.

The shifting device 50 is secured to the upper bearing blocks 35 of one of the slides 17, 18, these bearing blocks 35 being offset slightly upwards. These upper bearing blocks 35 carry at their upper edge a horizontal guide rod 51 extending from the rear end of the frame up to roughly the middle of the frame lengthwise. Guided on this guide rod 51 is a pusher 52 with a horizontal disposed gripper 53. The pusher 52 can be travelled on this guide rod by means of a motor (not shown). The pusher 52 as viewed at the front end (FIG. 4) has roughly the shape of an S so that it extends from above the guide rod 51 downwards for it to be arranged somewhat below the suction plate 47 in its upper position.

The operation of the unstacker will now be described:

At its face end (FIG. 4) upstream of the transport direction 5 the chute 30 is open so that a stack of circuit boards 55 can be manually inserted between the inner runs of the chains 31, 32 and placed on two supporting slats 38 opposing each other. The stack of circuit boards 55 is then lifted upwards until its upper edge has attained a predetermined height which is sensed by a sensor (not shown).

The suction plate 47 is then lowered onto the topmost circuit board 55 of the stack and this circuit board 55 is suctioned by the suction elements 48. The suction plate 47 is moved together with the circuit board 55 upwards into the upper position. Here, the pusher 52, located in its rear position, takes hold of the circuit board 55 by its gripper 53. The circuit board 55 is released from the suction plate 47 and transported by a movement of the pusher 52 along the guide rod 51 in the transport direction 5 and placed on the transport belt 4 on which the circuit board 55 is transported to the testing device 2. The pusher 52 is run back into its rear starting position and a further circuit board 55 is picked from the stack by means of the suction plate 47.

This procedure is repeated by a circuit board 55 being picked from the stack each time and supplied to the transport belt 4, the chains 31, 32 of the chute 30 being driven so that the circuit boards 55 are gradually advanced from below upwards so as to maintain the upper edge of the stack of circuit boards 55 always at a predetermined level.

Secured to each of the chains 31, 32 are several supporting slats 38 so that in the chute 30 at least two pairs of opposing supporting slats 38 can be located, thus enabling a further stack of circuit boards 55 to be introduced into the chute 30 when the stack of circuit boards 55 in the chute 30 during picking is coming to an end, this further stack being placed on supporting slats 38 arranged spaced away from the bottom of the upper stack. In this arrangement, the procedure for picking the circuit boards from the upper stack can be continued without interruption. Once the upper stack has been totally picked, the lower stack is transported upwards so that its topmost circuit board 55 can be received by the circuit board picker 40. Lifting the lower stack upwards into the picking position is done in synchronism with the circuit board picker 40 so that the circuit board picker 40 is able to continually pick the circuit boards 55 from the chute 30 without interruption.

The circuit boards 55 taken from the chute 30 are placed by the shifting device 50 onto the transport belt 4 and transported in the transport direction to the testing device 2. In the testing device 2, the circuit boards 55 are typically tested for shorts and open circuits. After testing, the circuit boards 55 are transported further to the restacker 3, they thereby being in continual contact with the narrow conveyor belts 4a, 4b of the transport belt 4.

Figure 5:
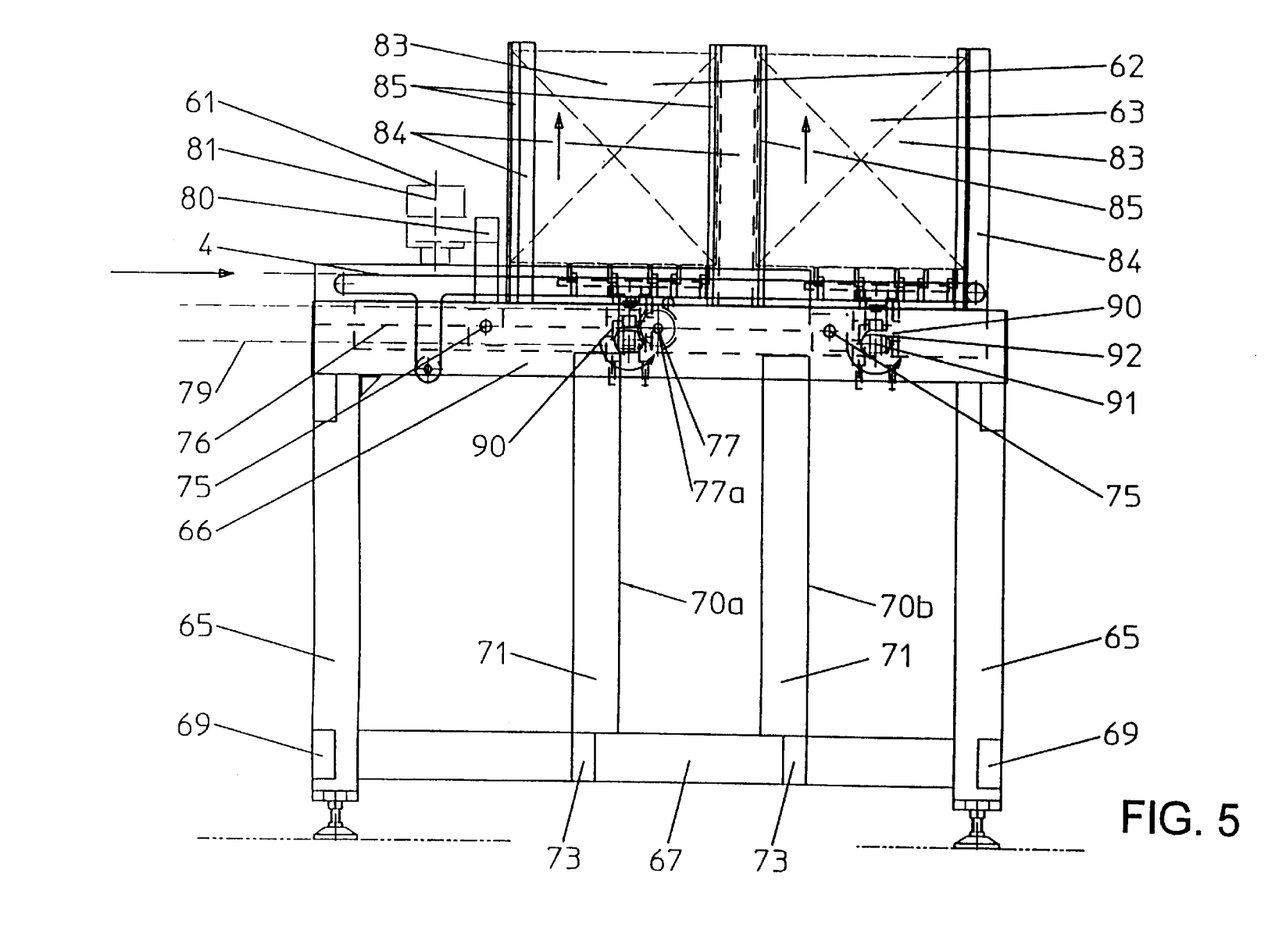
FIG. 5 is a side view of a restacker of the automated tester in accordance with the invention.
Figure 6:
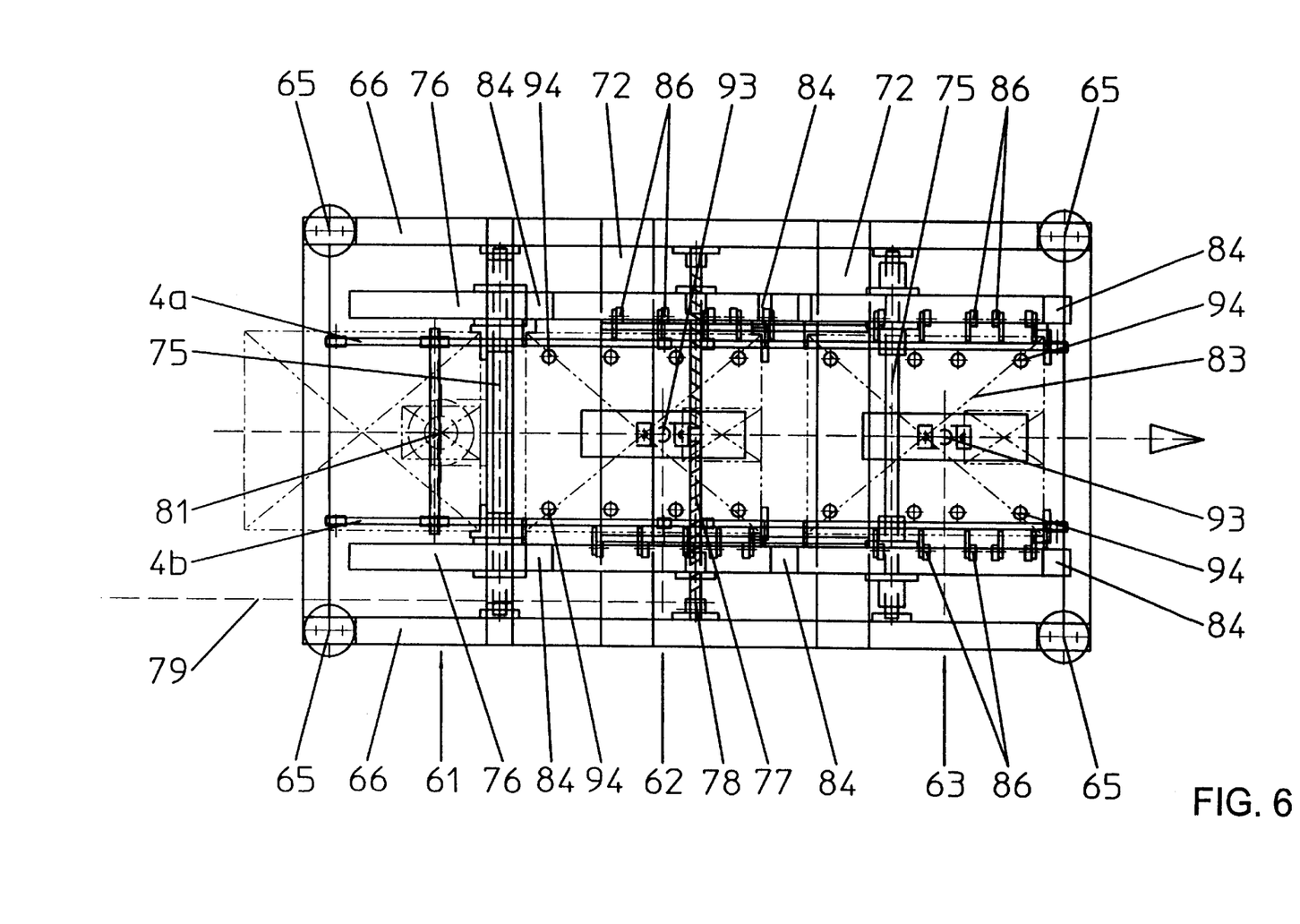
FIG. 6 is a plan view of the restacker shown in FIG. 5.
Figure 7:
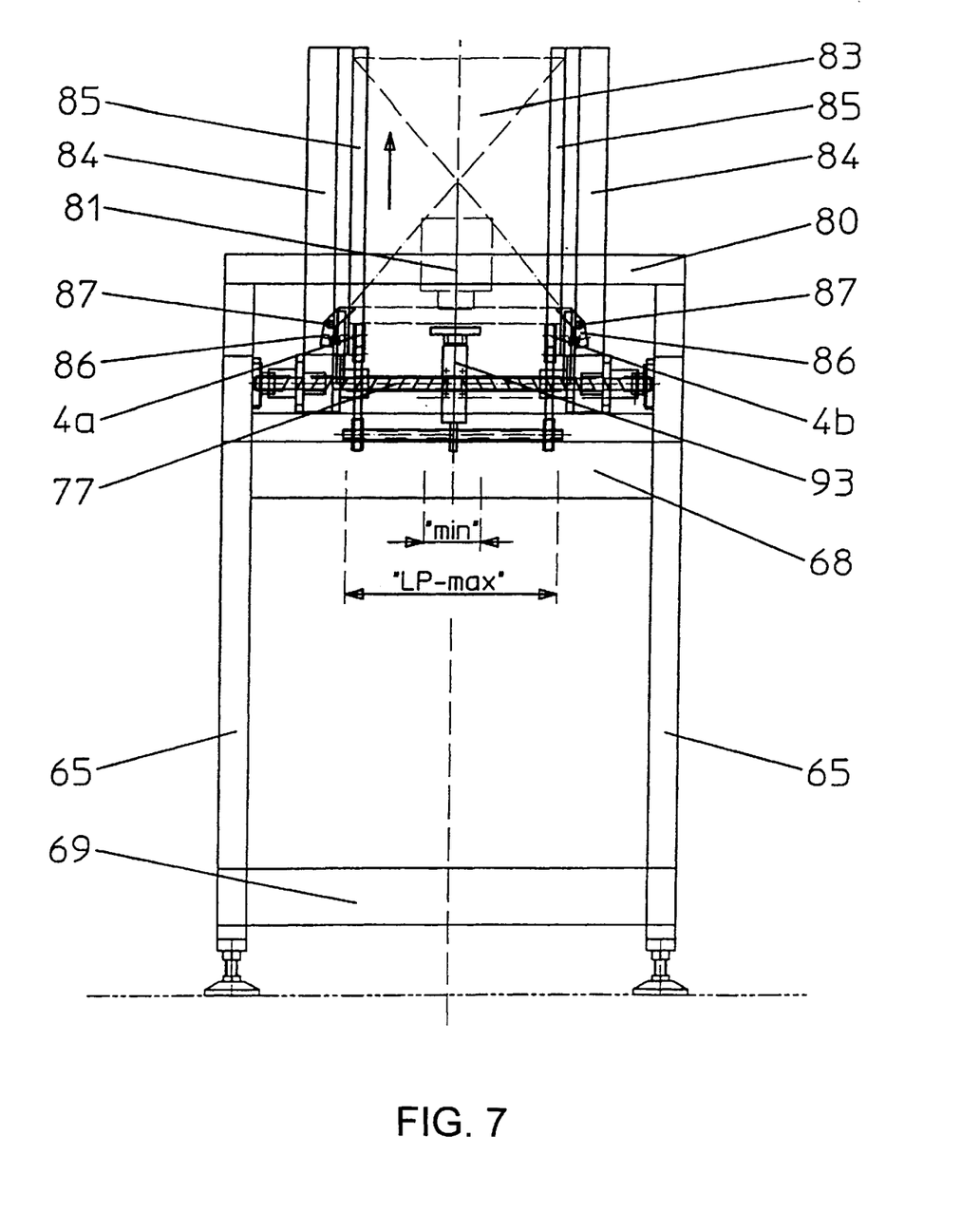
FIG. 7 is a front end view in the transport direction of the restacker shown in FIG. 5.

The restacker 3 shown in FIGS. 5, 6, and 7 is divided into three sectors arranged in sequence in the transport direction, namely the marking sector 61, the restacking sector 62 for faulty circuit boards (the NO GO sector) and the restacking sector 63 for faultless circuit boards (the GO sector).

The restacker comprises in turn a cube-shaped frame of four vertical corner beams 65, two upper longitudinal beams 66, two lower longitudinal beams 67, two upper crossbeams 68 and two lower crossbeams 69. Secured to the cube-shaped frame in turn are two supporting frames 70a, 70b, each supporting frame comprising two vertical beams 71 and upper and lower horizontal beam 72, 73 each. Each of the vertical beams 71 extends between an upper and lower longitudinal beam 66, 67 and the horizontal beams 72, 73 between the two upper longitudinal beams 66 and the two lower longitudinal beams 67 respectively.

Similar to the arrangement of the unstacker 1 two guide rods 75 are disposed transversely to the transport direction 5 between the upper longitudinal beams 66. Mounted on the guide rods 75 are two supporting slats 76 arranged parallel to the upper longitudinal beams 66. On the inner side of the supporting slats 76 guide rollers for the narrow transport belts 4a, 4b are mounted as shown in FIG. 6 schematically greatly simplified.

The two supporting slats 76 are passed through by a threaded rod 77 disposed transversely to the transport direction 5, this threaded rod being oriented parallel to the guide rods 75. In the middle of the threaded rod 77 lengthwise, the thread changes from a right-hand thread to a left-hand thread, and the threaded rod engages corresponding tappings 77a in the supporting slats 76. Disposed in each lateral region of the threaded rod 77 is a sprocket 78 about which a chain 79 is guided. This chain 79 extends up to threaded rod 24 of the unstacker 1 provided with the handwheel 28 where it is guided about a further sprocket (not shown) so that the rotating movement of the guide rods 24 and 77 is in synchronism, as a result of which a central adjustment of the track width of the transport belt of the unstacker 1 as well as of the restacker 3 is achieved. Preferably, the track width of the testing device is configured correspondingly adjustable and coupled to the chain 79 so that by turning the handwheel 28 the track width of the automated circuit board tester is adjusted as a whole.

In the marking sector 61 of the restacker 3, a U-shaped beam 80 open to the bottom is disposed, which is laterally supported by the upper longitudinal beams 66. Secured to the beam 80 is a marking device 81, known as such, providing the circuit boards passing underneath it with a predetermined mark, depending on the result of testing.

Each of the restacker sectors 62, 63 comprises a restacker chute 83 rectangular in cross-section, the corners of this chute being defined by columns 84. The columns 83 are secured to the upper side of the supporting slats 76 and oriented vertically. Releasably secured to the columns 84 are guide slats or guide plates 85. By swapping the guide slats or guide plates 85, the restacker chutes 83 can be adapted to the shape of the circuit boards. Secured to the supporting slats 76 between the columns 84 are several pawls 86, each of which protrudes into the interior of the chute by a swivably mounted pawl arm 87 (FIG. 7) and preloaded by a spring so that when a circuit board is lifted from the transport belt 4 the pawl arms 87 react elastically pliantly to allow a circuit board to be shifted into place from below into the restacker chute 83. In this arrangement the pawl arms 87 automatically swivel back into the interior of the chute so that one or more circuit boards are held in the restacker chute 83.

For lifting the circuit boards, a lifting device 90 is provided in each restacker chute in the region between the supporting slats 76. Each of these lifting devices 90 is powered by an electric motor 91 driving a camplate 92. Mounted on the camplate 92 is a horizontal lifting linkage comprising a central ram 93 as well as pushers 94 arranged in the edge portion. Due to a rotating movement of the camplate 92 both the central ram 93 as well as the pushers 94 are lifted so that a circuit board is supported at several points distributed about its surface area and is unable to tilt downwards when the circuit board is lifted even when it needs to bear the weight of a stack of circuit boards. The pushers are mounted in guides secured to the supporting slats 76 so that when the track width of the restacker is adjusted the arrangement of the pushers 94 complies accordingly.

The restacker in accordance with the invention supports the circuit boards two-dimensionally, as a result of which they are subjected to no bending and thus also to no damage. The restacker chutes 83 are preferably open on one side or the corresponding guide slats or guide plates 85 are configured hinged so that the restacker chutes 83 can be emptied during operation. As a result of this, continual operation of the automated circuit board tester as a whole is made possible.

It will be appreciated that the invention is not restricted to the transport device as cited in the example embodiment, such as the chains 31, 32 for lifting the circuit boards to be unstacked, or to the transport belt 4. Instead of the chains 31, 32 serving as the lifting device for lifting the circuit boards to be unstacked, spindle lifting device 100 (FIGS. 8*a*, 8*b*) may be used. One such spindle lifting device 100 comprises a vertically disposed, rotary driven spindle passing through a non-rotatable lifting element mating with the spindle. Secured to the lifting element is an elastically pliant supporting element 101 configured with an upper horizontal supporting edge 102 and a sliding edge 103 oriented slanting downwards. Each spindle lifting device 100 protrudes by its supporting elements 101 into the interior of the chute 30.

Figure 8A:
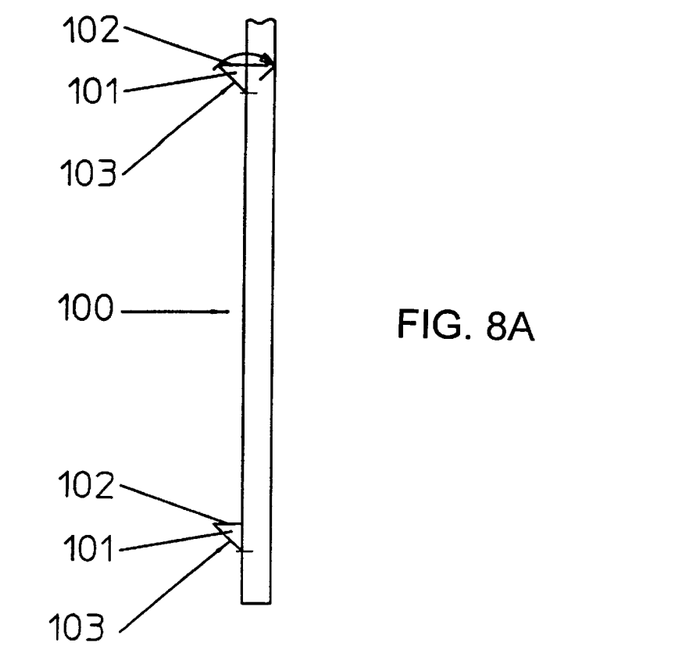
FIGS. 8A and 8B are simplified schematic side and front end views of a spindle lifting device for lifting the circuit boards to be picked in the unstacker shown in FIG. 1.
Figure 8B:
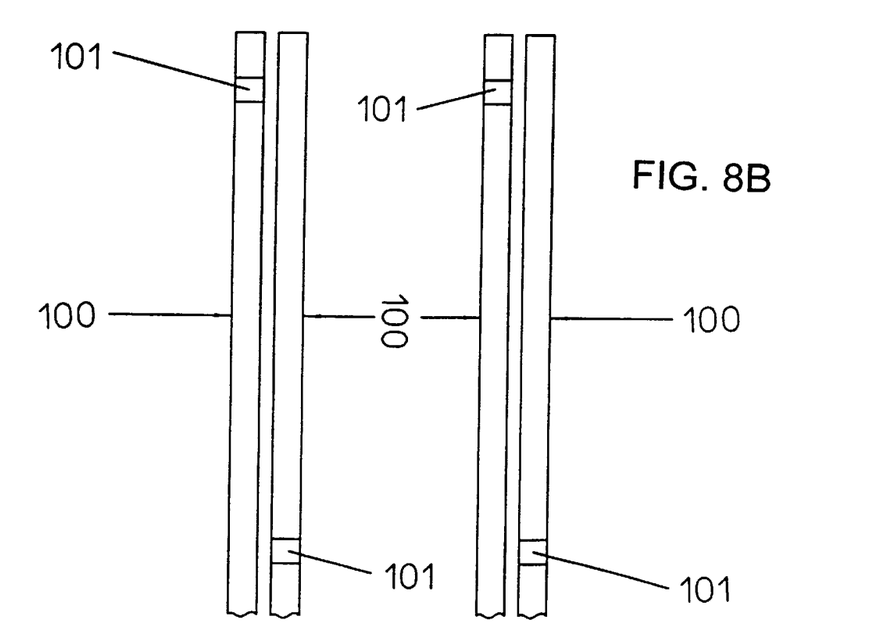

Arranged on each side of the chute are two pairs of the spindle lifting device 11 so that in all the chute 30 features eight spindle lifting device 100. For turning the spindles, the drive units are provided, each drive unit driving one spindle of the pair of spindle lifting devices. Accordingly, a set of four supporting elements 101 each of the four pairs of spindle lifting devices 100 are moved up and down in synchronism, the supporting elements 101 of one such set being arranged level. A stack of circuit boards can thus be placed on each set of supporting elements 101 and transported upwards.

Once a stack of circuit boards has been completely unstacked, the set of supporting elements 101 is transported downwards, they thereby flexibly moving out of the way by their inclined arrangement of sliding edges 103 from a new stack of circuit boards replenished from underneath by the other set of supporting elements 101 and sliding past the stack. This set of supporting elements 101 guided downwards can then be reloaded with a stack of circuit boards whilst circuit boards are unstacked from the other set of supporting elements 101. Accordingly, the picker 40 is able to pick circuit boards from the chute 30 continually replenished from underneath.

While this invention has been particularly shown and described with references to preferred embodiments thereof, it will be understood by those skilled in the art that various changes in form and detail may be made therein without departing from the spirit and scope of the invention as defined by the appended claims.

What is claimed is:

1. An automated circuit board tester comprising an unstacker arranged upstream of a testing device and which by means of a circuit board picker arranged above a chute picks a topmost circuit board from a stack of circuit boards located in the chute, wherein the chute comprises a lifting device including at least two sets of vertically traveling supporting elements, each of which is able to carry a stack of circuit boards, the chute being open at least on one side so that a set of supporting elements can be loaded while a stack of circuit boards located on the other set of supporting elements is unstacked by the circuit board picker;

wherein the circuit board picker is a pick-and-place device that comprises: a vertically oriented lifting device at the lower end of which a horizontally disposed suction plate having several suction elements is secured; and a shifting device for horizontally shifting the circuit boards suctioned by the suction plate, the shifting device comprising a horizontally traveling pusher provided with a gripper so that the gripper is able to grip a circuit board and place it on a transport belt by a horizontal shifting movement.

2. The tester as set forth in claim 1, wherein the chute is defined on two opposing sides by two vertically guided chains, each of the chains being connected to horizontally disposed supporting slats serving as supporting elements.

3. The tester as set forth in claim 2, wherein the chains of one chute side are guided to circulate about an upper shaft and a lower shaft.

4. The tester as set forth in claim 3, further comprising a drive device for driving one of the two shafts, the drive device being configured so that inner runs of the chains are transported upwards.

5. The tester as set forth in claim 4, wherein the elements are arranged on two slides mounted shiftably towards each other.

6. The tester as set forth in claim 1, wherein the lifting device comprises several spindle lifting units, each of which is configured with a vertically disposed, rotatably driven spindle passing through a non-rotatable lifting element mating with the spindle.

7. The tester as set forth in claim 6 further comprising the supporting elements being secured to the lifting elements, the supporting elements being elastically pliant and configured with an upper horizontal supporting edge and a sliding edge oriented slanting downwards, a supporting element of each spindle lifting unit protruding into the interior region of the chute.

8. The tester as set forth in claim 7, further comprising, arranged on each side of the chute, two pairs of spindle lifting units.

9. An automated circuit board tester comprising an unstacker arranged upstream of a testing device and which by means of a circuit board picker arranged above a chute picks a topmost circuit board from a stack of circuit boards located in the chute, wherein the chute comprises a lifting device including at least two sets of vertically traveling supporting elements, each of which is able to carry a stack of circuit boards, the chute being open at least on one side so that a set of supporting elements can be loaded while a stack of circuit boards located on the other set of supporting elements is unstacked by the circuit board picker;

wherein the supporting elements are arranged on two slides mounted shiftably towards each other, and the two slides are mounted on one or more guide rods and passed through by at least one rotatably disposed threaded rod in the middle of which lengthwise the thread changes from a right-hand thread to a left-hand thread so that the slides are moved towards each other or away from each other on turning of the threaded rod, and wherein the circuit board picker is a pick-and-place device that comprises a vertically oriented lifting device at the lower end of which a horizontally disposed suction plate having several suction elements is secured; and a shifting device for horizontally shifting the circuit boards suctioned by the suction plate, which comprises a horizontally traveling pusher provided with a gripper so that the gripper is able to grip a circuit board and place it on a transport belt by a horizontal shifting movement.

* * * * *